United States Patent [19]

Thompson

[11] Patent Number: 5,011,066

[45] Date of Patent: Apr. 30, 1991

[54] ENHANCED COLLAPSE SOLDER INTERCONNECTION

[75] Inventor: Kenneth R. Thompson, Sunrise, Fla.

[73] Assignee: Motorola, Inc., Schaumburg, Ill.

[21] Appl. No.: 558,939

[22] Filed: Jul. 27, 1990

[51] Int. Cl.⁵ .......................... B23K 31/02; H05K 3/34
[52] U.S. Cl. .................................. 228/180.2; 228/215; 361/406; 174/261
[58] Field of Search ...................... 228/180.2, 214, 215, 228/123; 361/404, 406, 409; 174/261

[56] References Cited

U.S. PATENT DOCUMENTS

| | | | |
|---|---|---|---|
| 4,376,505 | 3/1983 | Wojcik | 228/215 |
| 4,545,610 | 10/1985 | Lakritz et al. | 228/180.2 |
| 4,558,812 | 12/1985 | Bailey et al. | |
| 4,609,892 | 9/1986 | Higgins, Jr. | |
| 4,821,946 | 4/1989 | Abe et al. | 228/248 |
| 4,878,611 | 11/1989 | LoVasco et al. | 228/180.2 |
| 4,889,275 | 12/1989 | Mullen, III et al. | |

OTHER PUBLICATIONS

P. M. Hall, "Solder Post Attachment of Ceramic Chip Carriers to Ceramic Film Integrated Circuits", IEE Transactions: Components, Hybrids, and Manufacturing Technology, vol. 4, Dec. 1981, p. 403.

R. H. Minetti, "Solid Phase Bonding for Use in the Assembly of Micro-Electronics Circuits", ISHM, 1980, p. 126.

IBM Technical Disclosure Bulletin, "Via Interposer . . . ", vol. 30, No. 7, pp. 126, 127, Dec. 1987.

*Primary Examiner*—Sam Heinrich
*Attorney, Agent, or Firm*—Daniel K. Nichols

[57] ABSTRACT

A soldered electrical interconnection is made between a device and a circuit carrying substrate. A device (200) is formed with two solderable surfaces, the second solderable surface (204) adjacent to, but not touching, the first solderable surface (202). A sphere of solder (206) is placed upon a solderable surface (202) of the device and reflowed. The component and solder sphere assembly is placed on a circuit carrying substrate (210) and reflowed, such that the solder sphere reflows and is wetted to both solderable surfaces on the device.

11 Claims, 2 Drawing Sheets

ENHANCED COLLAPSE SOLDER INTERCONNECTION

TECHNICAL FIELD

This invention relates generally to electrical interconnection devices, and more specifically to a means of soldering and interconnecting a component to a circuit carrying substrate.

BACKGROUND

There exists a need to reliably interconnect very high density leadless circuit packages to circuit carrying substrates. Conventional design chip carriers employ solder joints on the peripheral edges of the leadless circuit package to interconnect to the circuit carrying substrate. This method produces large solder joints that are difficult to dimensionally control, due to variations in the amount of solder deposited, variations in the amount of solderable surface area and variations in the quality of the solderable surfaces. In addition, these types of leadless circuit packages are not amendable to very high density interconnection, due to constraints in the physical size of the solder joint needed and the lack of useable area on the perimeter of the carrier.

Very high density interconnect schemes employ an array of solderable pads on the underside of the leadless circuit package. This type of carrier is capable of significant higher density interconnections, and is known as a pad array chip carrier. Interconnecting these carriers to circuit carrying substrates is a difficult process, requiring very strict control of the dimensional tolerances of the components and the many processing variables in the soldering operaton.

One solution to this problem is to provide a fixed amount of solder on the pads of the pad array chip carrier prior to reflow to the circuit carrying substrate. Referring to FIG. 1, a pad array chip carrier 100 contains a solderable pad 102 configured such that the cross-sectional area and shape corresponds approximately to the cross-sectional area and shape of a solder sphere 106. The solder sphere 106 is then placed on the pad 102 and reflowed using methods known to those in the art. When complete, the pad array chip carrier has an array of precisely defined solder spheres attached to each solderable pad. The pad array chip carrier assembly (100 and 106) is placed on the circuit carrying substrate 110 and oriented such that the soldered sphere is aligned to and touching solderable pad 108 (FIG. 1B). The assembly is reflow soldered a second time to solder the pad array chip assembly to the circuit carrying substrate (FIG. 1C).

During the soldering operation, the distance between the pad array chip carrier and the circuit carrying substrate is typically reduced by 35-40%. This distance reduction is referred to as "collapse". Dimensional variations (camber) in the circuit carrying substrate and the pad array chip carrier cause the initial distance between the pad array chip carrier and the circuit carrying substrate to be non-uniform. This non-uniformity prevents some of the solder spheres from contacting the circuit carrying substrate. The collapse is not large enough to insure that every one of the spheres are soldered to the circuit carrying substrate, and some interconnections are not formed. In a typical pad array chip carrier, at least 64 and as many as 256 interconnections may be needed, and failure of only one interconnect constitutes failure of the entire device. The dimensional variations serve to impose an upper limit on the physical size of the pad array chip carrier that may be reliably interconnected. Using materials meeting industry standards of quality, pad array chip carriers no greater than 0.7 inch $\times$ 0.7 inch can be used, thus limiting the maximum number of interconnections to less than 100.

Mismatches in the thermal co-efficient of expansion between the pad array chip carrier and the circuit carrying substrate impose large stresses on the assembled package during thermal excursions. To minimize these stresses, larger solder pad areas are employed in certain areas, such the corners of the device, to reduce the amount of stress. The use of large solder pads on the underside of the pad array chip carrier reduces the height of the resultant solder sphere, thus reducing the amount of collapse during reflow to the circuit carrying substrate. A typical situation is a collapse of only 20%. This attempt to reduce solder joint stress results in a reduction in the collapse, and thus a reduction in the amount of allowable tolerances, and non-uniformity between the two components, a reduction in the size of a pad array chip carrier that can be used, and an increase in the number of unsoldered connections. The amount of collapse may be restored by comparably increasing the size of the solder sphere, However, this solution is only applicable to those cases where all the pads are of uniform size, and results in significantly decreased interconnection density. If it is desired to effect larger pads in selected areas only, such as corners of the pad array chip carrier, multiple sizes of solder spheres must be employed in order to achieve a uniform height of spheres on the underside to the pad array chip carrier prior to attachment to the circuit carrying substrate. In practice, this solution is difficult to achieve, and requires a significant increase in the complexity and amount of tooling necessary to precisely place solder spheres of multiple diameter on the same pad array chip carrier.

Clearly, a need exists to achieve increased collapse distance and to accommodate the use of pads of mixed sizes within a single pad array chip carrier.

SUMMARY OF THE INVENTION

Briefly, according to the invention, a soldered electrical interconnection is made between a device and a circuit carrying substrate. A device is formed with two solderable surfaces, the second surface adjacent to, but not touching, the first surface. A sphere of solder is placed upon the first solderable surface of the device and reflowed. The device and solder sphere assembly is placed on the circuit carrying substrate and reflowed into place, such that the solder sphere reflows and is wetted to both of the solderable surface on the device and also the circuit carrying substrate, forming a low profile solder assembly.

DETAILED DESCRIPTION OF THE PREFERRED EMBODIMENT

Figure 2A:
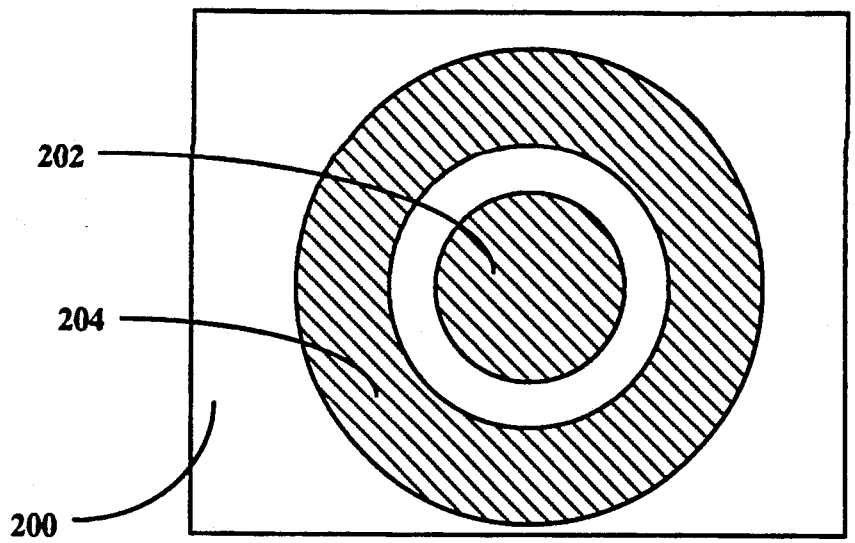
FIG. 2A is an illustration of typical solderable surfaces on a circuit carrying substrate in accordance with the invention.
Figure 2B:
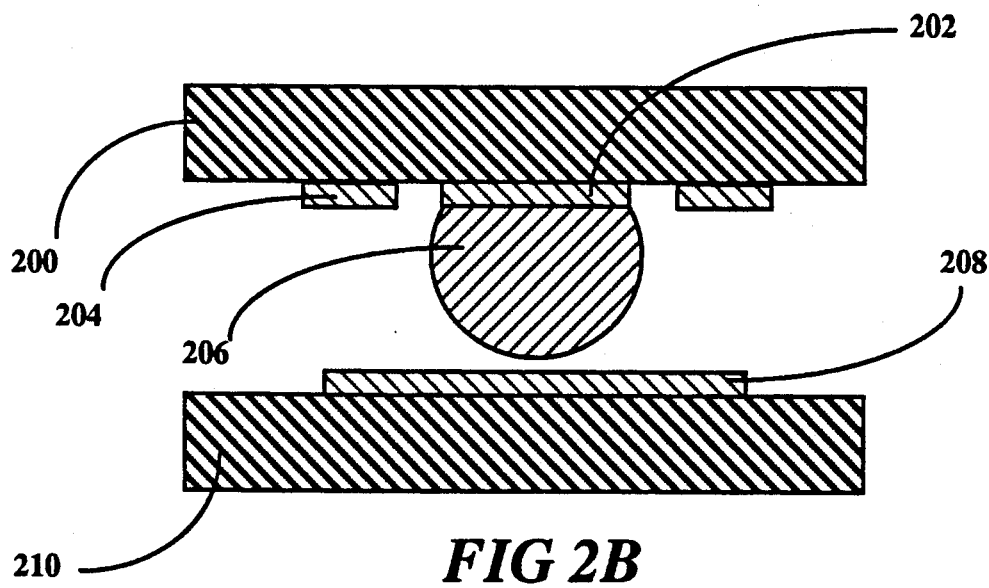
FIG. 2B is an illustration of a device with a solder sphere prior to attachment to a circuit carrying substrate.
Figure 2C:
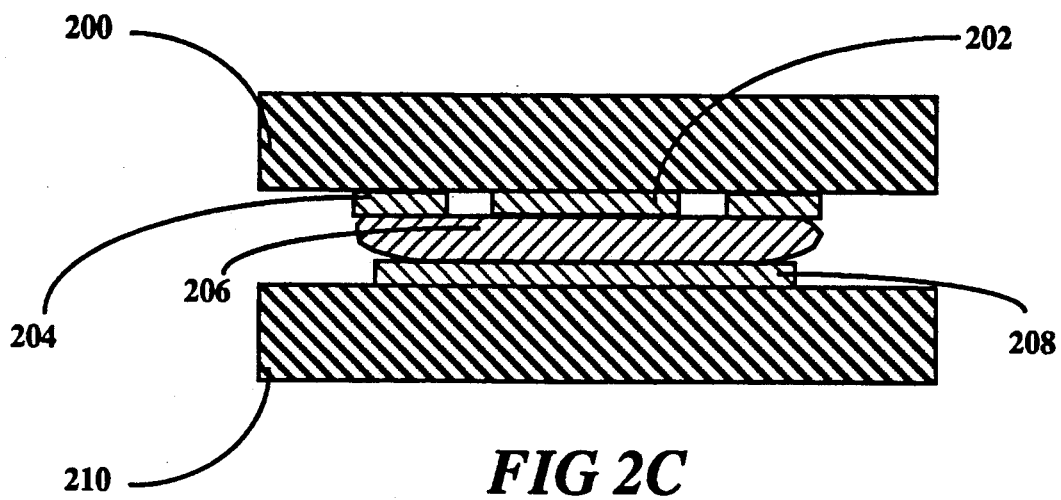
FIG. 2C is an illustration of a device with a solder sphere after attachment to a circuit carrying substrate in accordance with the invention.

It should be appreciated by those skilled in the art that although the figures show only one example of a solder connection, numerous connections could be made on a single component. The preferred embodiment of the invention can be seen in FIGS. 2A, 2B, and 2C. Referring to FIG. 2A, a component or substrate 200 contains a solderable surface or solder pad 202 configured such that the cross-sectional area is significantly less than the cross-sectional area of a solder bump or sphere 106. The configuration of the solderable surface 202, although shown as a circle, may be other appropriate shapes. The component 200 also contains a closely spaced solderable surface 204 configured such that it is adjacent, but not connecting, to the solderable surface 202. The configuration of the second solderable surface 204, although shown as a concentric ring, can be non-concentric, non-circular, an incomplete ring, or shaped in numerous other manners. Typically, when using a solder sphere of 0.030 inch diameter, solder pad 202 is 0.020 inch, the space between the solder pad 202 and the adjacent solderable surface 204 is 0.005 inch, and the width of the adjacent solderable surfaces is 0.010 inch. The solder sphere 206 is placed on the solderable surface 202 and reflowed using methods well known to those in the art. Referring to FIG. 2B the resulting component assembly (200 and 206) is placed on the circuit carrying substrate 210 and oriented such that the soldered sphere is aligned to and touching the solderable surface 208. The entire assembly is reflowed in using methods known to those in the art. During reflow, the solder sphere 206 melts and is wetted to the solderable surface 208. The weight of the component 200 causes the solder sphere 206 to deform. As seen in FIG. 2C, this deformation causes the solder sphere 206 to expand and touch solderable surface 204, wetting thereto, and resulting in further deformation and flattening of the solder sphere 206. The enhanced collapse of the solder sphere by this method results in an assembly containing a solder sphere that is only 42% of the original height of the sphere. It should be appreciated that a solderable surface 208 that is approximately the same diameter as solderable surface 204 enhances the wetting force, further inducing collapse of the solder sphere, but this is not a necessary condition for the invention.

Figure 1A:
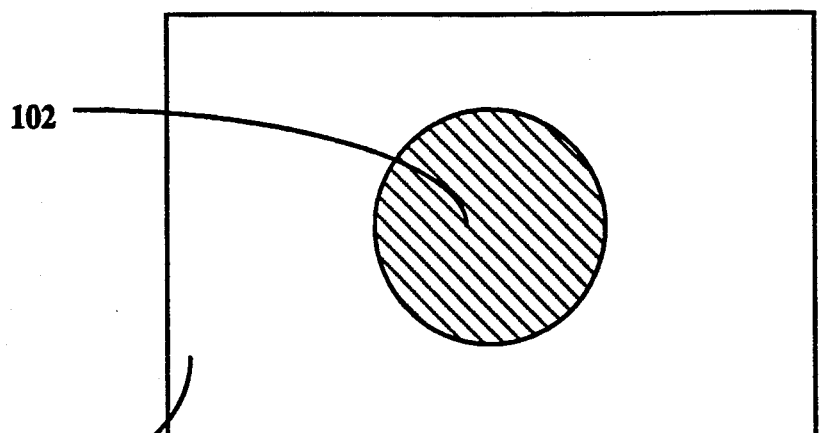
FIG. 1A is an illustration of typical solderable surfaces on a device and a circuit carrying substrate in accordance with prior art.
Figure 1B:
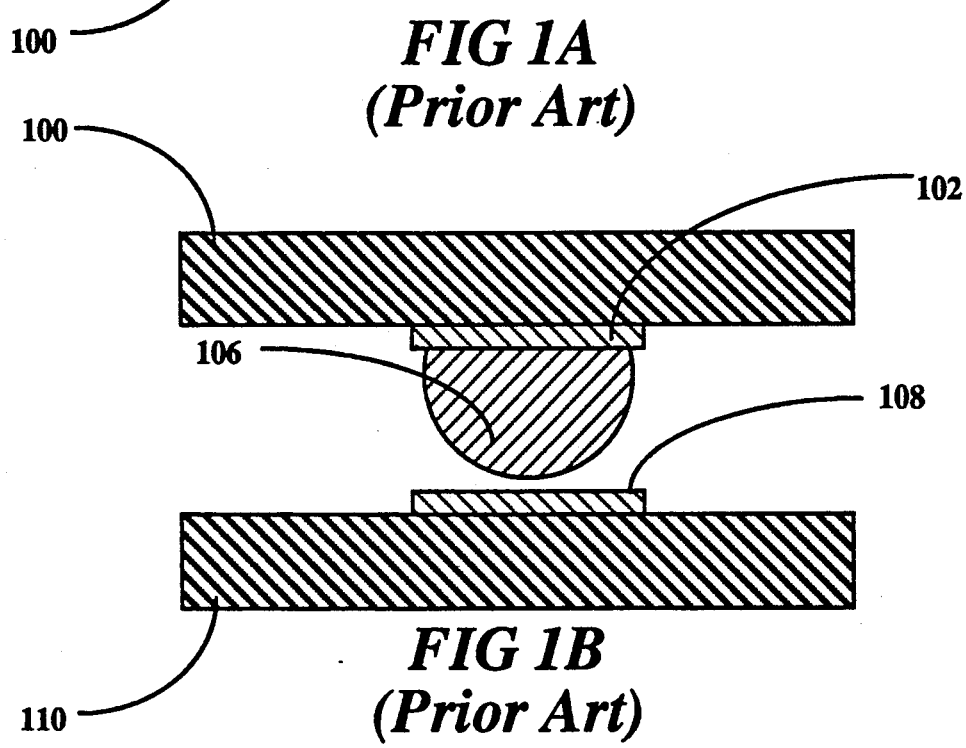
FIG. 1B is an illustration of a device with a solder sphere prior to attachment to a carrying substrate.
Figure 1C:
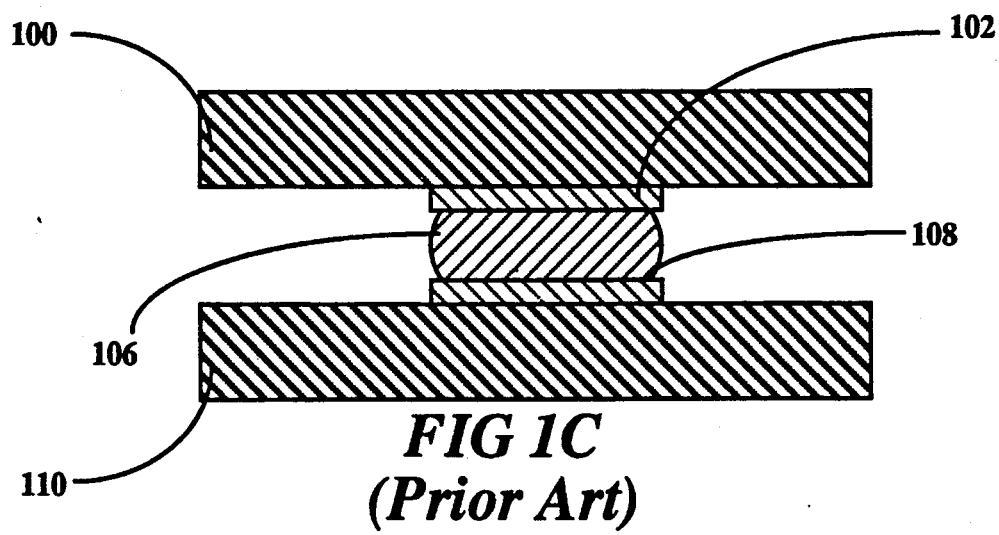
FIG. 1C is an illustration of a device with a solder sphere after attachment to a circuit carrying substrate.

Referring to FIG. 1C, it can be seen that the collapse of the solder sphere in the prior art results in an assembly containing a solder sphere that is 65% of the original height of the sphere. The enhanced collapse provided by the invention accommodates soldered interconnections using components that have a disparity of solder sphere heights, and circuit carrying substrates that are not perfectly planar. By varying the dimensions of the solderable surfaces, one can also cause the amount of collapse to be varied.

Figure 3A:
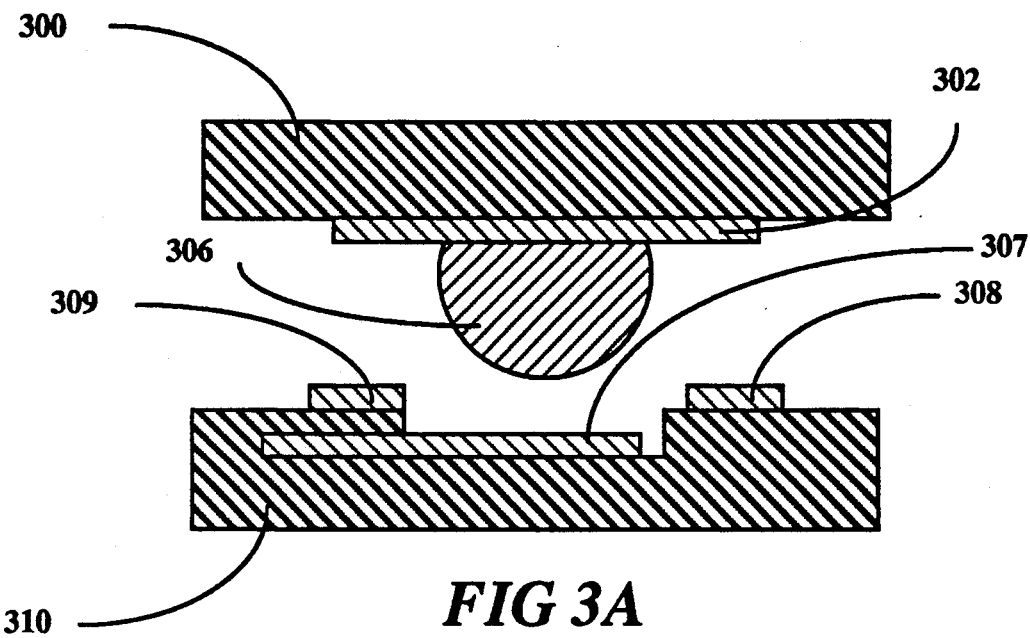
FIG. 3A is an illustration of a device with a solder sphere prior to attachment to a multi-level circuit carrying substrate in an alternate embodiment of the invention.
Figure 3B:
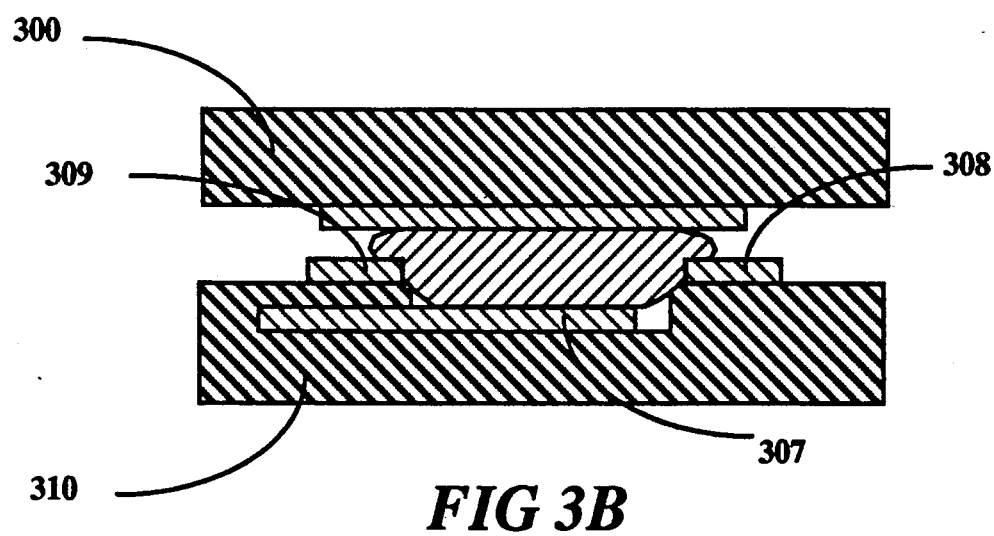
FIG. 3B is an illustration of a device with a solder sphere after attachment to a mulit-level circuit carrying substrate.

Referring to FIG. 3A, an alternate embodiment of the invention prior to solder interconnection can be seen. The component assembly (300 and 306) is placed on a multi-level circuit carrying substrate 310 and oriented such that the soldered sphere is aligned to and touching the solderable surface 307. The entire assembly is then reflowed using methods know to those in the art. During reflow, the solder sphere 306 melts and wets to the solderable surface 307, 308 and 309. The weight of the component 300 causes the solder sphere 306 to deform. This deformation causes the solder sphere 306 to expand and touch the solderable surfaces 307, 308 and 309, wetting thereto, producing further deformation and flattening of the solder sphere 306 (FIG. 3B)

What is claimed:

1. An enhanced collapse solder interconnect assembly comprising:
    a pair of substrates having solderable surfaces on opposing faces, at least one solderable surface on at least one of the substrates including an associated closely spaced solderable surface; and
    solder interconnecting the solderable surfaces of the substrates: the solder connecting to the associated closely spaced solderable surface upon melting and collapsing.

2. An enhanced collapse solder interconnect assembly as defined in claim 1 in which said associated closely spaced solderable surface is substantially circumferential to said at least one of the solderable surfaces.

3. An enhanced collapse solder interconnect assembly as defined in claim 1 wherein the solder provides electrical connection between the solderable surface of the first substrate and the associated solderable surface of the second substrate.

4. A method of manufacturing an enhanced collapse solder interconnect assembly comprising the steps of:
    providing a first substrate having at least one solder pad having an associated substantially peripheral closely spaced solderable surface;
    providing a second substrate having at least one solder pad;
    providing a solder bump on at least one of the solder pads;
    positioning the substrates into an adjacent location with the solder pads in register;
    reflowing the solder bump to interconnect the solder pad of the first substrate to the associated substantially peripheral closely spaced solderable surface, and to the solder pad of the second substrate.

5. A method of manufacturing an enhanced collapse solder interconnect assembly as defined in claim 4 wherein the step of providing a solder bump comprises providing solder and reflowing the solder to the solder pad.

6. A method of manufacturing an enhanced collapse solder interconnect assembly as defined in claim 4 wherein the step of providing a solder bump comprises providing a solder sphere and reflowing the solder sphere to the solder pad.

7. A method of manufacturing an enhanced collapse solder interconnect assembly as defined in claim 4 wherein said solder bump is provided on the first substrate.

8. A method of manufacturing an enhanced collapse solder interconnect assembly as defined in claim 3 wherein the solder bump is provided on the second substrate.

9. An enhanced collapse solder interconnect assembly comprising:
a first substrate having a plurality of solder pads, at least one pad having an associated substantially peripheral closely spaced solderable surface;
a second substrate having a plurality of solder pads;
solder interconnecting the solder pads of the first and second substrates.

10. An enhanced collapse solder interconnect assembly as defined in claim 9 wherein the solder provides electrical connection between the solder pads of the first substrate and the associated solder pads of the second substrate.

11. An enhanced collapse solder interconnect assembly as defined in claim 9 wherein both substrates have at least one pad having an associated substantially peripheral closely spaced solderable surface.

* * * * *